US012740023B2

(12) United States Patent
Wu et al.

(10) Patent No.: US 12,740,023 B2
(45) Date of Patent: Sep. 15, 2026

(54) JOINT MODULE, SERVER, AND COMPUTING SYSTEM

(71) Applicant: Fulian Precision Electronics (Tianjin) Co., LTD., Tianjin (CN)

(72) Inventors: Chang-Ju Wu, New Taipei (TW); Chih-Min Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 290 days.

(21) Appl. No.: 18/665,451

(22) Filed: May 15, 2024

(65) Prior Publication Data

US 2025/0081393 A1 Mar. 6, 2025

(30) Foreign Application Priority Data

Aug. 31, 2023 (CN) .......................... 202311114587.4

(51) Int. Cl.
*H05K 7/20* (2006.01)

(52) U.S. Cl.
CPC ..... *H05K 7/20781* (2013.01); *H05K 7/20272* (2013.01); *H05K 7/20772* (2013.01)

(58) Field of Classification Search
CPC ........... H05K 7/20272; H05K 7/20781; H05K 7/20772; F16L 21/08; F16L 29/02; F16L 33/00
See application file for complete search history.

(56) References Cited

U.S. PATENT DOCUMENTS

| | | | | |
|---|---|---|---|---|
| 9,351,428 | B2 * | 5/2016 | Eckberg | F16L 37/34 |
| 10,921,070 | B2 * | 2/2021 | Chen | H05K 7/20272 |
| 11,828,379 | B2 * | 11/2023 | Shih | F16K 3/314 |
| 11,892,252 | B2 * | 2/2024 | Yang | H05K 7/20772 |
| 12,477,686 | B2 * | 11/2025 | Utz | H05K 7/20272 |

FOREIGN PATENT DOCUMENTS

| | | |
|---|---|---|
| CN | 115515375 | 12/2022 |
| CN | 115773416 | 3/2023 |

* cited by examiner

*Primary Examiner* — Zachary Pape
(74) *Attorney, Agent, or Firm* — ScienBiziP, P.C.

(57) ABSTRACT

A joint module for cutting coolant circuit in a server comprises a base, a first moving piece, a second moving piece, a drive component, and a plug connector located on the first moving piece. The first moving piece is movable in a first direction between a first position and a second position. The second moving piece is movable in a second direction between a third position and a fourth position. The drive component moves the second moving piece. When the second moving piece is on the third position, the first moving piece is on the first position and the plug connector is connected to a plug. When the second moving piece is on the fourth position, the first moving piece is on the second position and the plug connector is disconnected with the plug. A server and a computing system with the joint module are also disclosed.

20 Claims, 11 Drawing Sheets

JOINT MODULE, SERVER, AND COMPUTING SYSTEM

FIELD

The disclosure herein generally relates to information computing systems, and more particularly relates to a joint module, a server, and a computing system.

BACKGROUND

When a server is installed in a rack, a plug connector behind the server is connected to a plug on the rack, so that the rack can provide coolant to the server to cool the server. However, there is a risk of coolant leakage, and when the coolant leak in the server, if the coolant circuit is not cut in time, a large amount of coolant will enter the server, causing damage to the server.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
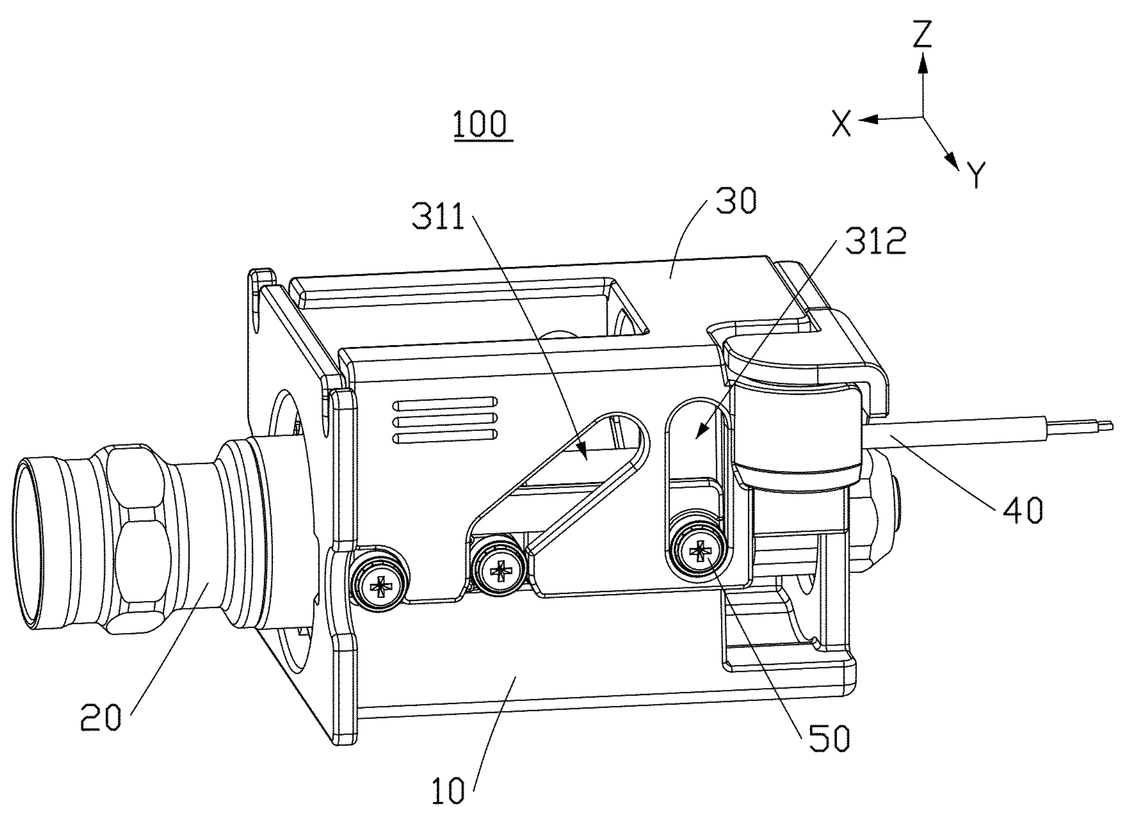
FIG. 1 is an isometric view of an embodiment of a joint module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
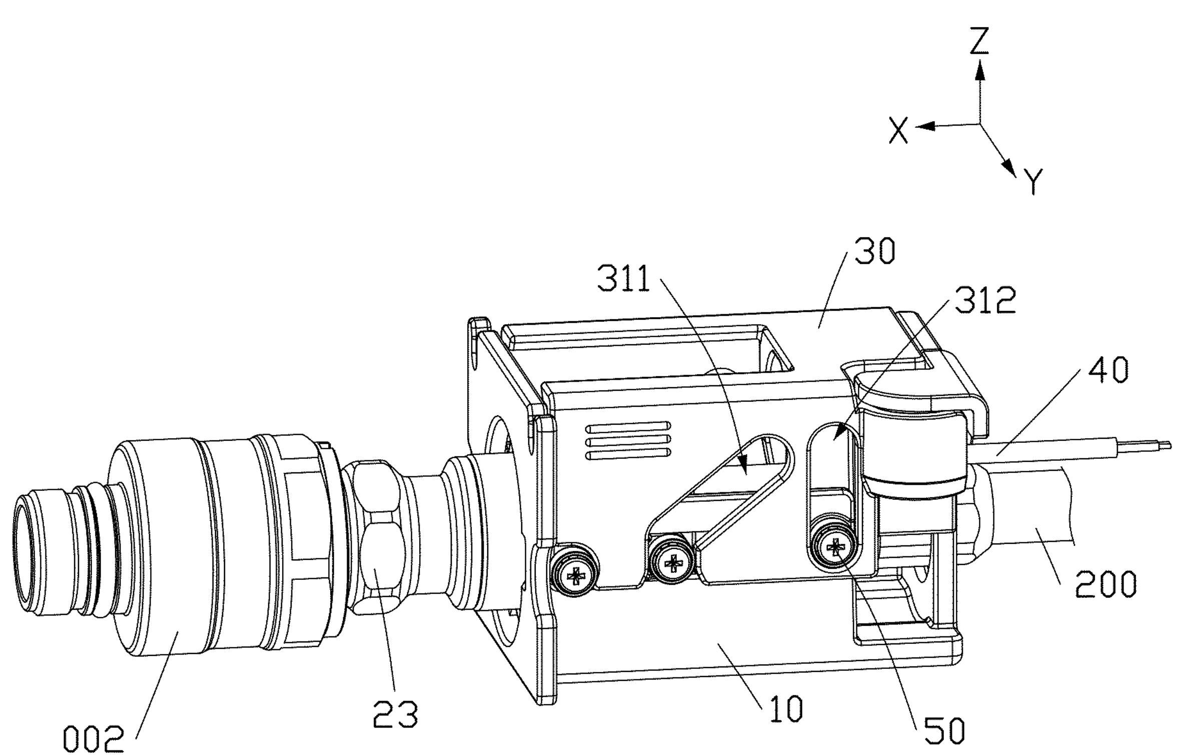
FIG. 2 is an isometric view of the joint module shown in FIG. 1, showing a plug connector connected to a plug.
Figure 3:
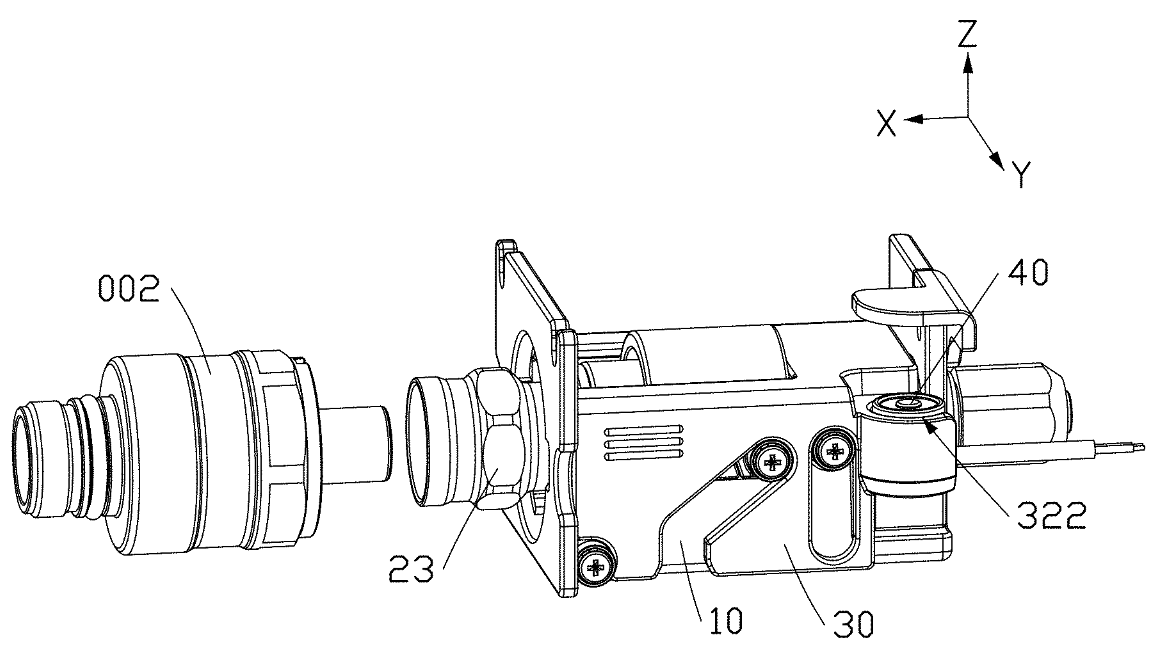
FIG. 3 is an isometric view of the joint module shown in FIG. 1, showing a plug connector disconnected to a plug.
Figure 4:
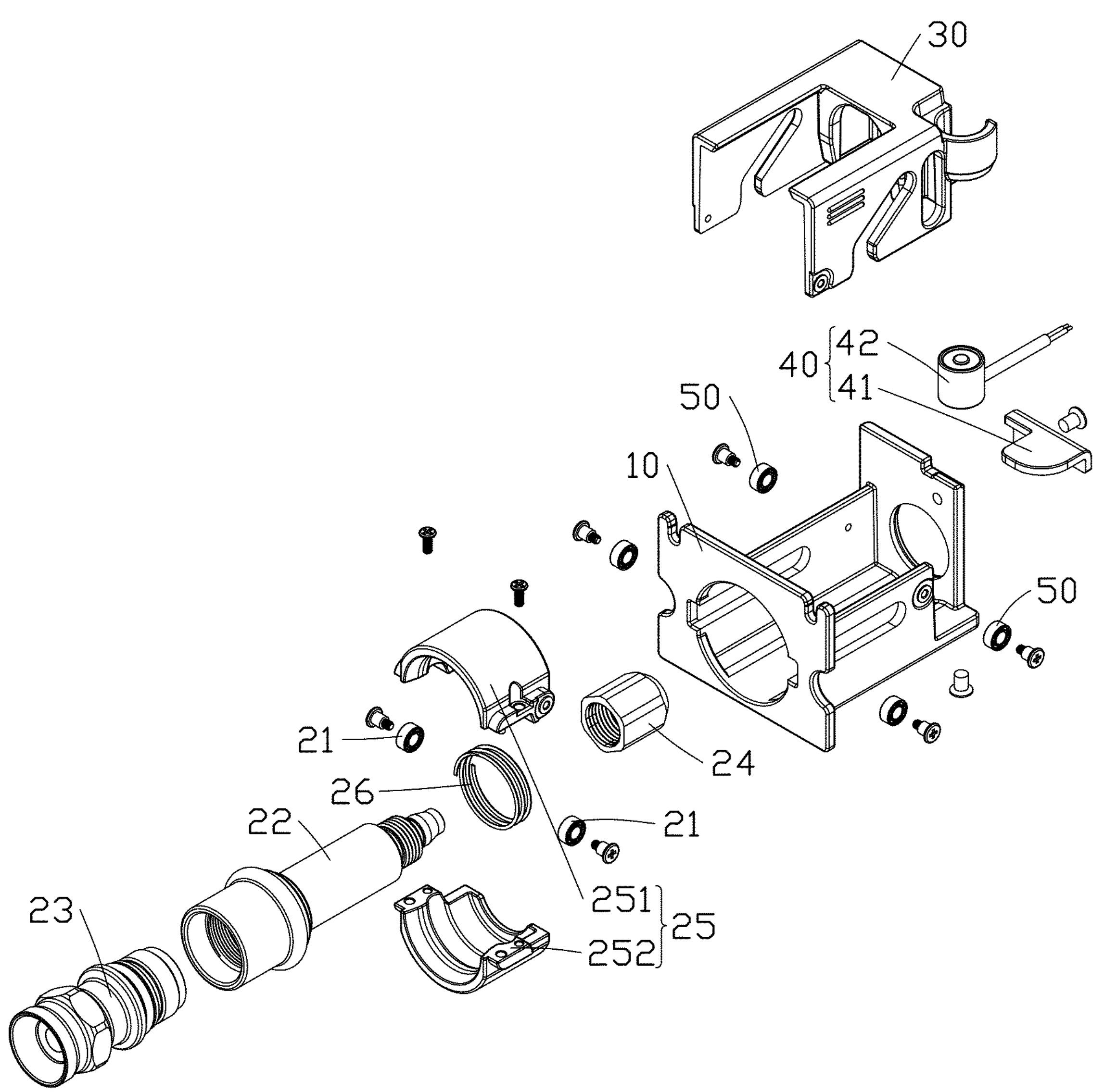
FIG. 4 is an exploded view of the joint module shown in FIG. 1.
Figure 5:
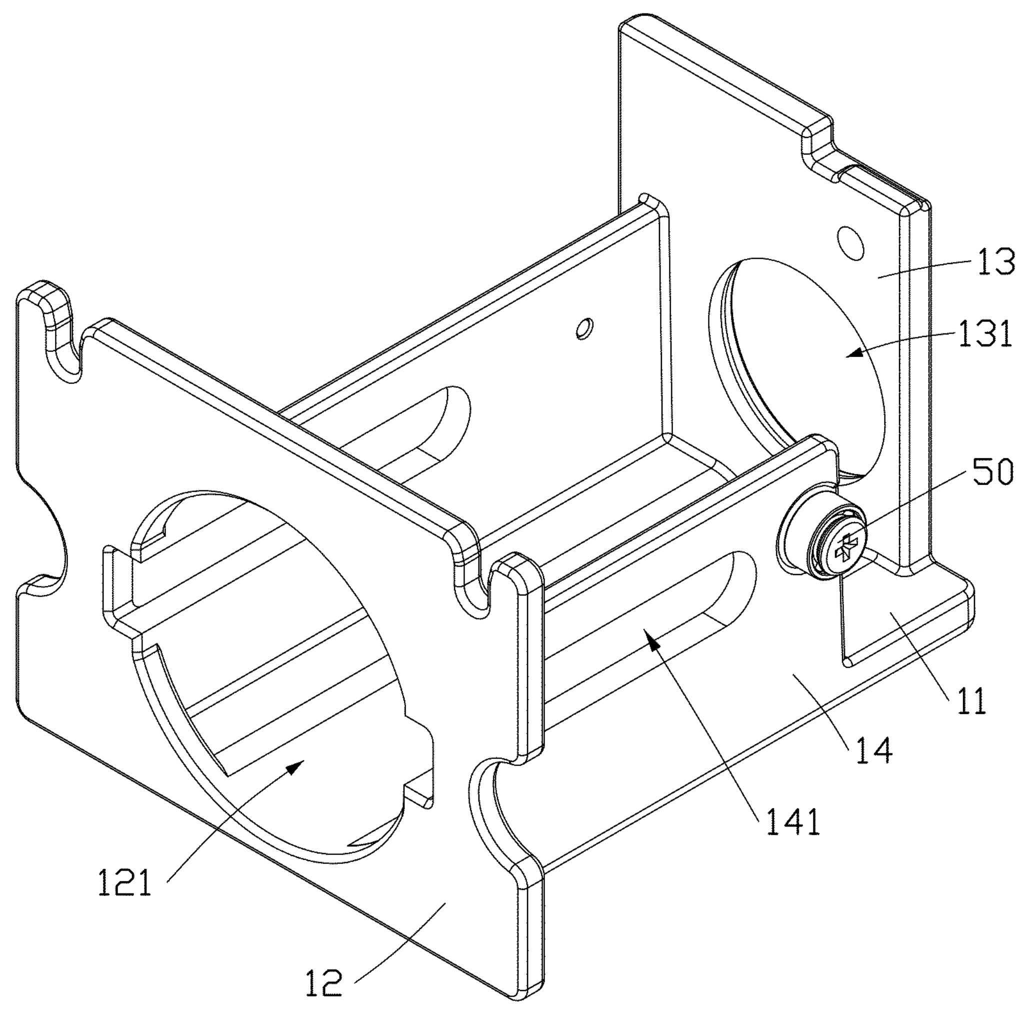
FIG. 5 is an isometric view of a base of the joint module shown in FIG. 1.
Figure 6:
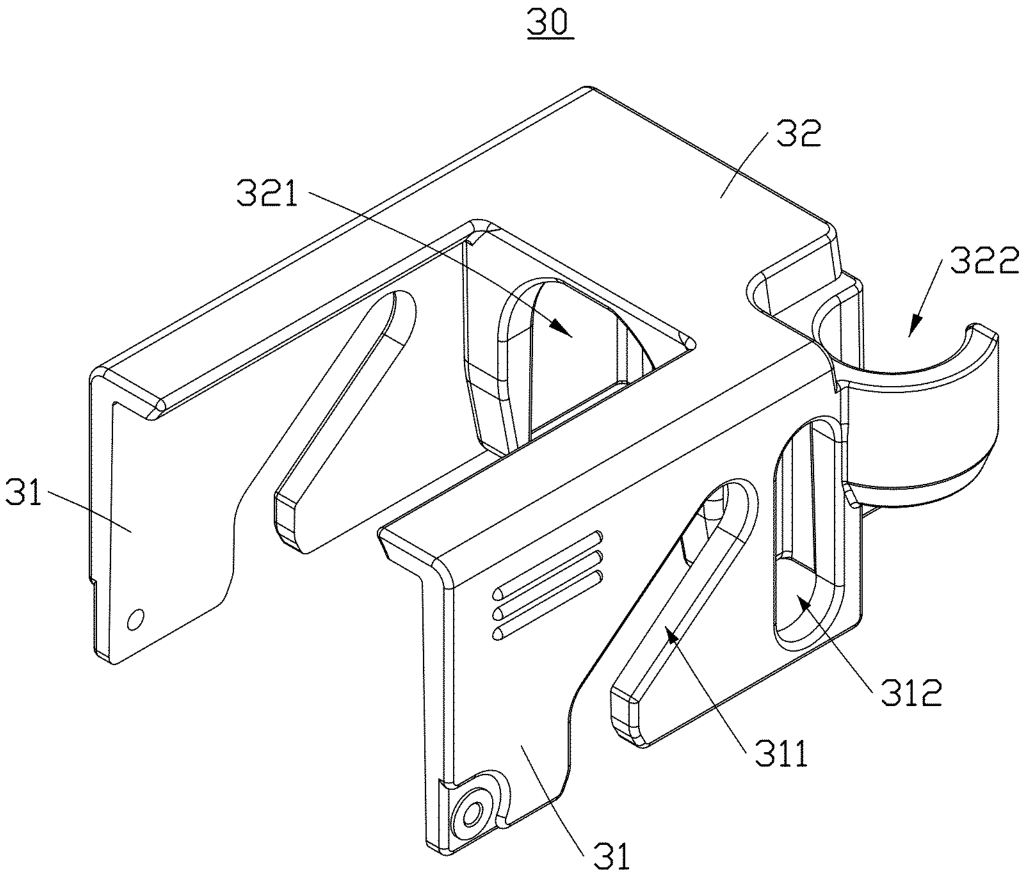
FIG. 6 is an isometric view of a second moving piece of the joint module shown in FIG. 1.
Figure 7:
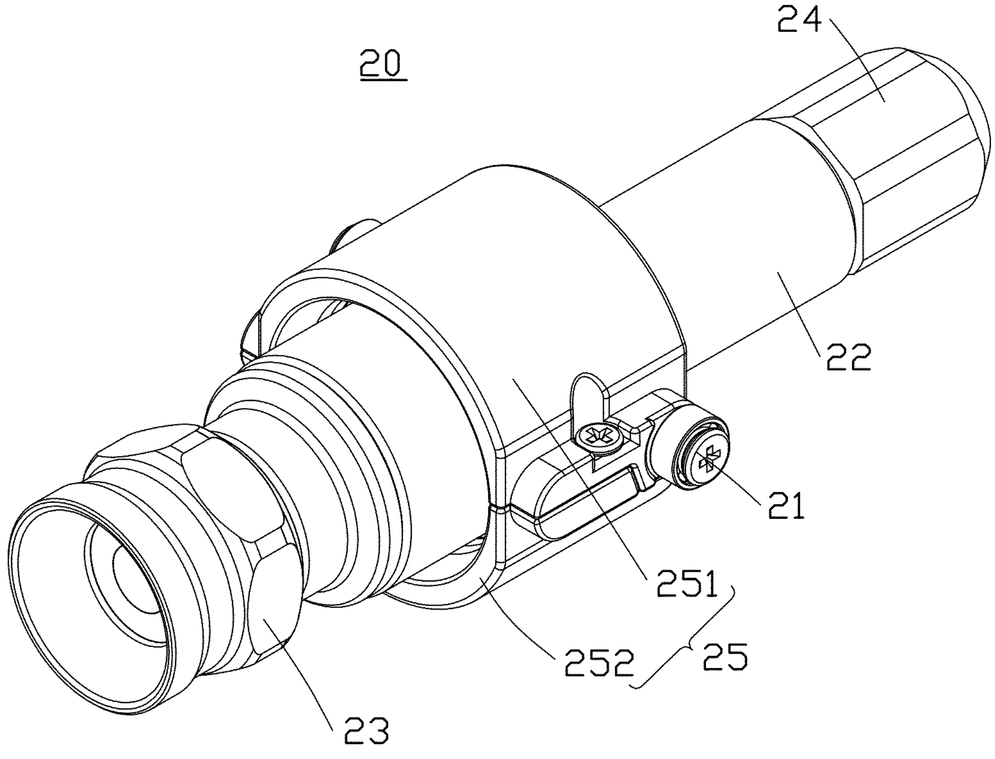
FIG. 7 is an isometric view of a first moving piece of the joint module shown in FIG. 1.
Figure 8:
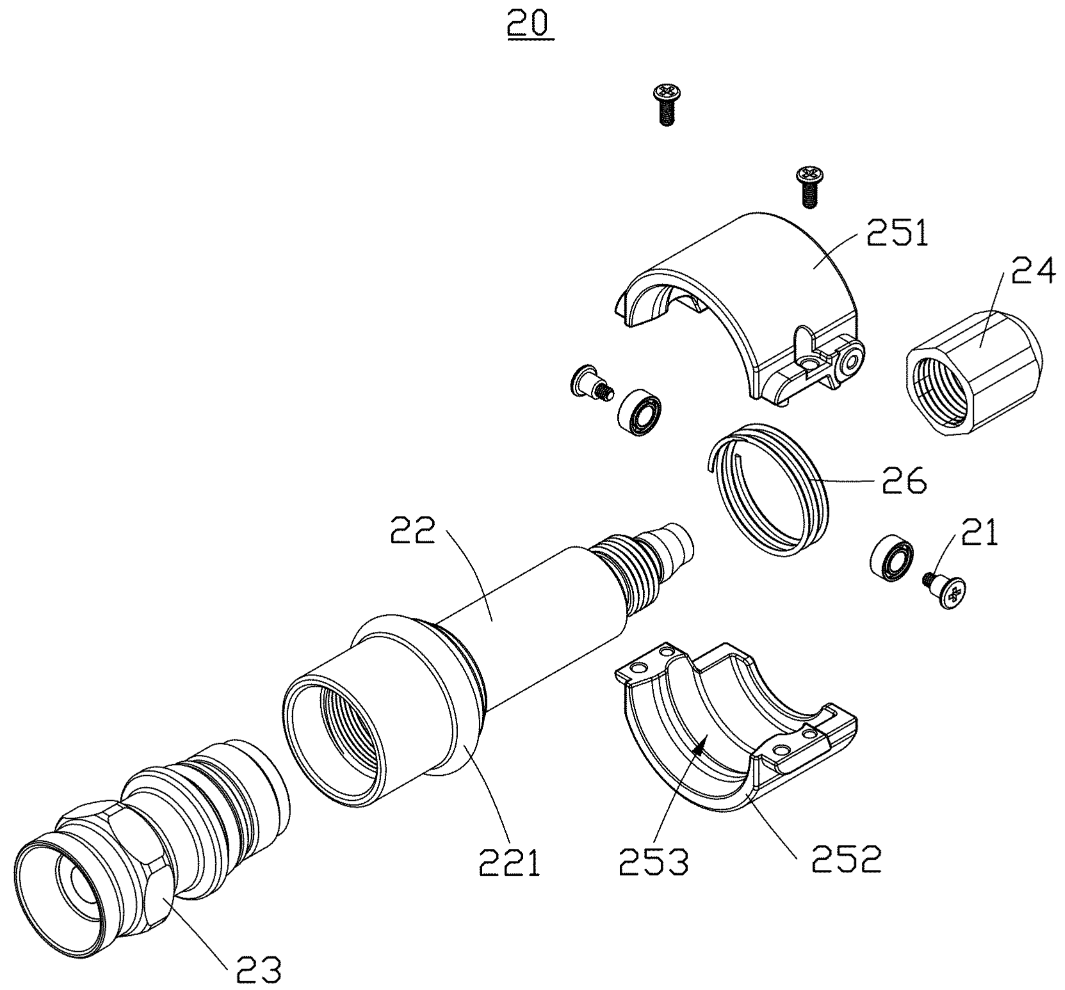
FIG. 8 is an exploded view of the first moving piece shown in FIG. 7.
Figure 9:
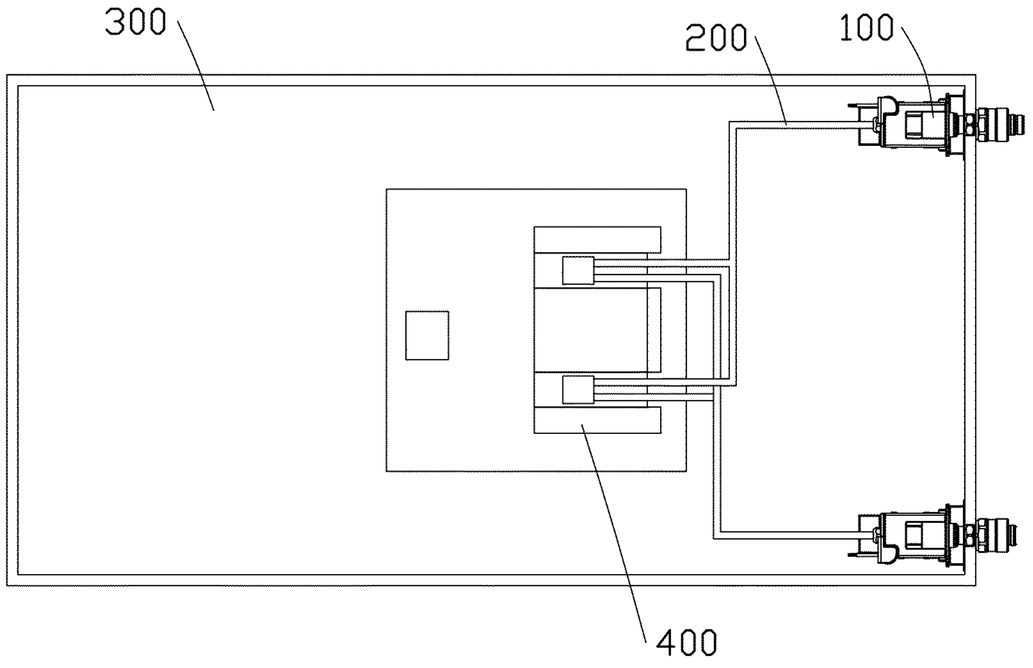
FIG. 9 is a diagram view of an embodiment of a server according to the present disclosure.
Figure 10:
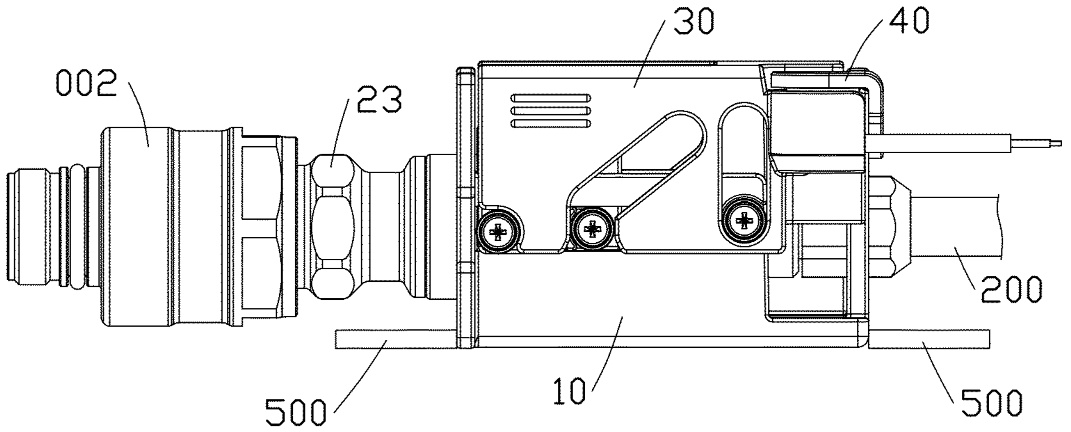
FIG. 10 is a side view of the joint module and the plug shown in FIG. 2.
Figure 11:
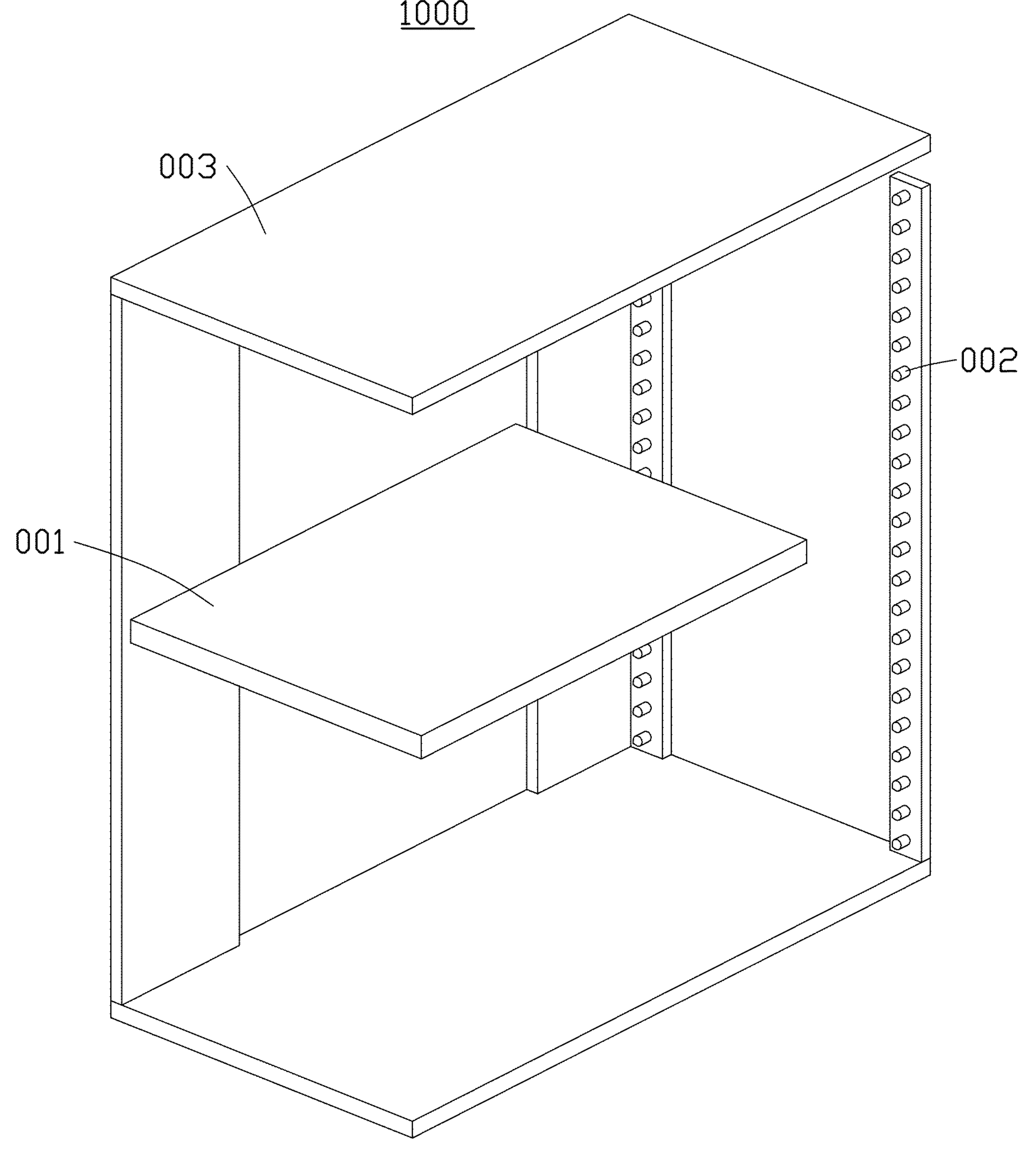
FIG. 11 is an isometric view of an embodiment of a computing system according to the present disclosure.

As shown in FIG. 1 to FIG. 11, a computing system 1000 in an embodiment includes a rack 003 and a plurality of servers 001. The plurality of servers 001 can be installed into the rack 003 in layers. The rack 003 includes a plurality of plugs 002, and there is at least one plug 002 in each layer. Each server 001 has a plug connector 23 in the back. When one of the plurality of servers 001 is installed into the rack 003, the plug connector 23 needs to be connected to the plug 002 in the same layer, so that the rack 003 can provide coolant to the server 001 to cool the server 001. Usually, there are two plugs 002 in each layer in the rack 003, and there are two plug connectors 23 in the back of each server 001, when the server 001 is installed into the rack 003, the two plug connectors 23 are connected to the two plugs 002 one-to-one, so that the coolant can be circulated between the server 001 and the rack 003.

However, there is a risk of coolant leakage, and when the coolant leak in the server 001, if the coolant circuit is not cut in time, the coolant will enter the server 001, causing damage to the server 001.

In some embodiments, to solve the problem mentioned above, the server 001 in an embodiment includes a chassis 300, an electronic part 400, a coolant circuit 200, and a joint module 100. The joint module 100, the electronic part 400, and the coolant circuit 200 are located on the chassis 300. The coolant enters or leaves the coolant circuit 200 by the plug 002 and the plug connectors 23, so the coolant circuit 200 can cool the electronic part 400. If there is any coolant leakage in the server 001, the joint module 100 disconnects the plug connectors 23 with the plug 002, to cut the coolant circuit for protecting the server 001.

The joint module 100 in an embodiment includes a base 10, a first moving piece 20, a second moving piece 30, a drive component 40, and a plug connector 23. The first moving piece 20 is located on the base 10 and is movable in a first direction X relative to the base 10 between a first position and a second position. The second moving piece 30 is located on the base 10 and is movable in a second direction Z relative to the base 10 between a third position and a fourth position. The second direction Z is perpendicular to the first direction X. The drive component 40 is used for moving the second moving piece 30 between the third position and the fourth position. The plug connector 23 is located on the first moving piece 20 and used for connecting the plug 002. When the second moving piece 30 moves to the third position, the first moving piece 20 is positioned on the first position, and the plug connector 23 is connected to the plug 002. When the second moving piece 30 moves to the fourth position, the first moving piece 20 is positioned on the second position, and because the second position is further away from the plug 002 than the first position, the plug connector 23 is disconnected with the plug 002.

When there is no coolant leakage, the first moving piece 20 is on the first position, and the coolant passes through plug 002, the first moving piece 20 and the coolant circuit 200 in sequence. When the coolant leaks in the server 001, the second moving piece 30 moves in the second direction Z to the fourth position, to move the first moving piece 20 in the first direction X to the second position, then the plug connector 23 is disconnected with the plug 002, so to stop the coolant from leaking in the server 001, protecting the server 001.

Since the moving direction of the second moving piece 30 is perpendicular to the moving direction of the first moving piece 20, the length of the joint module 100 in the first direction X can be reduced.

In some embodiments, the coolant circuit 200 is a hose to facilitate the movement of the first moving piece 20 in the first direction X.

In some embodiments, the first moving piece 20 and the plug 002 are both equipped with valves. When the plug connector 23 and the plug 002 are disconnected, the valves automatically close to prevent the coolant from flowing out from the plug connector 23 and the plug 002.

In some embodiments, the first direction X is horizontal, and the second direction Z is vertical, and the third position is above the fourth position. The drive component 40 is used for moving the second moving piece 30 from the fourth position up to the third position and keeping the second moving piece 30 on the third position. When the drive component 40 release the second moving piece 30, the second moving piece 30 drops from the third position to the fourth position by gravity.

During the disconnection between the plug connector 23 and the plug 002, the pressure of the coolant pushes the first moving piece 20 to the second position, which helps the plug connector 23 to disconnect from the plug 002.

In some embodiments, the base 10 includes a bottom board 11, a front board 12, a back board 13 and two side boards 14. The front board 12 and the back board 13 are arranged at intervals along the first direction X. The front board 12 is arranged at one end of the bottom board 11, and the back board 13 is arranged at the other end of the bottom board 11. The front board 12 is provided with a front hole 121, and the front hole 121 runs through the front board 12 along the first direction X. The back board 13 is provided with a back hole 131, and the back hole 131 runs through the back board 13 along the first direction X. The front hole 121 and the back hole 131 are coaxially arranged, and the first moving piece 20 passes through the front hole 121 and the back hole 131.

The two side boards 14 are arranged on opposite sides of the bottom board 11 at intervals along a third direction Y. Each side board 14 extends along the first direction X. One end of each side board 14 is connected to the front board 12, and the other end is connected to the back board 13. The first moving piece 20 is located between the two side boards 14. The first moving piece 20 is slidably connected to the two side boards 14 along the first direction X. The second moving piece 30 is slidably connected to the two side boards 14 along the second direction Z.

In some embodiments, each side board 14 is provided with a horizontal groove 141. The horizontal groove 141 extends along the first direction X. The first moving piece 20 includes the first pin 21. The first pin 21 is slidably placed in the horizontal groove 141 so that the first moving piece 20 can slide along the first direction X. When the first pin 21 is located at one end of the horizontal groove 141, the first moving piece 20 is located on the first position. When the slide is located at the other end of the horizontal groove 141, the first moving piece 20 is located on the second position.

The second moving piece 30 has a chute 311, and the chute 311 tilts. The first pin 21 is also slidably placed in the chute 311. Since the first pin 21 is located at both the horizontal groove 141 and the chute 311, when the second moving piece 30 slides upward or downward, the first pin 21 is restricted by side walls of the chute 311, allowing the first moving piece 20 to move along the first direction X.

In some embodiments, the joint module 100 further includes two second pins 50. Each of the two second pins 50 is located on each of the two side boards 14. The second moving piece 30 has two vertical slots 312. The two vertical slots 312 are located on opposite sides of the second moving piece 30. Each second pin 50 is movably located in each vertical slot 312 to enable the second moving piece 30 to slide relative to the base 10 in the second direction Z.

In some embodiments, the second moving piece 30 includes two sliding boards 31 and a middle part 32. The two sliding boards 31 are arranged at intervals along the third direction Y. Each chute 311 and each vertical slot 312 is located on a sliding board 31 and run through the sliding board 31 along the third direction Y. The middle part 32 is connected between the two sliding boards 31. The middle part 32 is provided with a horizontal slot 321, and the horizontal slot 321 runs through the middle part 32 along the first direction X for the first moving piece 20 to pass through the middle part 32. The shape of the middle part 32 is an inverted U shape. The middle part 32 is provided with an installation slot 322, and the drive component 40 is placed in the installation slot 322.

In some embodiments, the drive component 40 includes a magnet 41 and an electromagnet 42. The electromagnet 42 is placed in the installing slot 322 of the second moving piece 30. The magnet 41 is located on the top of the back board 13, and the magnet 41 is above the electromagnet 42. The electromagnet 42 is magnetic when powered off and attracts the magnet 41, to move the second moving piece 30 up and keep the second moving piece 30 on the third position. The electromagnet 42 is un-magnetic when powered on, to release the second moving piece 30 for letting the second moving piece 30 drop down to the fourth position.

Because the plug connector 23 and the plug 002 only be disconnected when the coolant leaks, the time for the plug connector 23 to be connected to the plug 002 is usually longer than the time for the plug connector 23 to be disconnected from the plug 002. Thus, the power-off time of the electromagnet 42 is longer than the power-on time, which can reduce the power-on time of the electromagnet 42 and reduce heat.

The electromagnet 42 includes a permanent magnet (not shown in FIGs) and a coil (not shown in FIGs). When the power is turned off for the electromagnet 42, the permanent magnet has magnetic force to attract the magnet 41. When the power is turned on, the coil in the electromagnet 42 generates magnetic poles, and the magnetic poles of the coil are opposite to the magnetic poles of the permanent magnet, so the magnetic field of the permanent magnet is weakened by the coil, to demagnetizing the permanent magnet.

In some embodiments, the first moving piece 20 further includes a tube 22, a tube connector 24 and a supporting shell 25. The tube 22 extends along the first direction X. The plug connector 23 is connected to one end of the tube 22, and the tube connector 24 is connected to the other end of the tube 22. The tube connector 24 is used to connect the coolant circuit 200 of the server 001. The supporting shell 25 is set on the tube 22, and the tube 22 passes through the supporting shell 25, and the supporting shell 25 is located between the front board 12 and the middle part 32. The first pins 21 are located in supporting shell 25.

In some embodiments, supporting shell 25 includes an upper semicircular shell 251 and a lower semicircular shell 252, for installing the tube 22 and the supporting shell 25.

In some embodiments, sometimes the plug connector 23 is not aligned with the plug 002 due to manufacturing tolerances for example, resulting in the plug connector 23 being unable to connect the plug 002. To solve this problem, a bulge ring 221 protrudes from an outer surface of the tube 22. The supporting shell 25 defines an annular arc groove 253. The section shapes of the annular arc groove 253 and the bulge ring 221 are arc-shaped, and a width of the annular arc groove 253 is larger than a width of the bulge ring 221, so the bulge ring 221 is swingable in the annular arc groove 253, which means the tube 22 can rotate in a small angle around any radial direction of the axis of the tube 22. If the plug 002 is not aligned with the plug connector 23, the plug 002 will force the plug connector 23 to rotate in a small angle when the plug 002 contact the plug connector 23, to force the plug connector 23 to be aligned with the plug 002, so that the plug connector 23 is able to connect the plug 002 properly, realizing a function of auto-calibration.

Furthermore, a spring 26 is placed in the supporting shell 25 to reset the tube 22, and an axis of the tube 22 is parallel to the first direction X when the tube 22 is reset, for preparing for the next connection of the plug 002 and the plug connector 23.

In some embodiments, the chassis 300 has a coolant gathering slot (not shown in FIGs). The server 001 further includes a sensor 500. The sensor 500 is placed in the coolant gathering slot below the first moving piece 20. The sensor 500 is used for detecting the sealing of the first moving piece 20 and the coolant circuit 200 as well as the first moving piece 20 and the plug 002. When sensor 500 detects that there is coolant in the coolant gathering slot, which means that the coolant leaks, the electromagnet 42 is powered on to disconnect the plug connector 23 from the plug 002.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A joint module comprising:

a base;

a first moving piece located on the base and movable in a first direction between a first position and a second position;

a second moving piece located on the base and movable in a second direction between a third position and a fourth position, the second direction being substantially perpendicular to the first direction;

a drive component located on the base and the second moving piece, the drive component being configured for moving the second moving piece between the third position and the fourth position; and a plug connector located on the first moving piece and configured for connecting a plug, wherein when the second moving piece is on the third position, the first moving piece is on the first position, and the plug connector is connected to the plug, when the second moving piece is on the fourth position, the first moving piece is on the second position, and the plug connector is disconnected with the plug.

2. The joint module of claim 1, wherein the first direction is horizontal, the second direction is vertical, the third position is above the fourth position, the drive component is configured for moving the second moving piece from the fourth position up to the third position and keeping the second moving piece on the third position, when the drive component releases the second moving piece, the second moving piece drops from the third position to the fourth position by gravity.

3. The joint module of claim 2, wherein the second moving piece defines a chute, the base defines a horizontal groove, the first moving piece comprises a first pin, the first pin is slidably located in the chute and the horizontal groove, when the second moving piece moves, the first pin slides along the chute and the horizontal groove.

4. The joint module of claim 1, wherein the drive component comprises a magnet and electromagnet, the magnet is located on the top of the base, the electromagnet is located on the second moving piece, the electromagnet is magnetic when powered off and attracts the magnet, the electromagnet is un-magnetic when powered on.

5. The joint module of claim 2, wherein the second moving piece defines a vertical slot, the base comprises a second pin, the second pin is slidably located in the vertical slot.

6. The joint module of claim 1, wherein the first moving piece comprises a tube, a tube connector, and a supporting shell, the tube extends in the first direction, the plug connector is located on an end of the tube, the tube connector is located on another end of the tube away from the plug connector, the supporting shell is located on the tube, and the tube passes through the supporting shell, a first pin is located on the supporting shell.

7. The joint module of claim 6, wherein a bulge ring protrudes from an outer surface of the tube, the supporting shell defines an annular arc groove, section shapes of the annular arc groove and the bulge ring are arc-shaped, and a width of the annular arc groove is larger than a width of the bulge ring, the bulge ring is swingable in the annular arc groove, a spring is located in the supporting shell to reset the tube, an axis of the tube is parallel to the first direction when the tube is reset.

8. A server comprising:

a chassis;

an electronic part located in the chassis;

a coolant circuit located in the chassis and configured for cooling the electronic part; and a joint module located on the chassis, the joint module comprising:

a base;

a first moving piece located on the base and movable in a first direction between a first position and a second position, the first moving piece being connected with the coolant circuit;

a second moving piece located on the base and movable in a second direction between a third position and a fourth position, the second direction being substantially perpendicular to the first direction;

a drive component located on the base and the second moving piece, the drive component being configured for moving the second moving piece between the third position and the fourth position; and a plug connector located on the first moving piece and configured for connecting a plug to circulate coolant in the coolant circuit, wherein when the second moving piece is on the third position, the first moving piece is on the first position, and the plug connector is connected to the plug, when the second moving piece is on the fourth position, the first moving piece is on the second position, and the plug connector is disconnected with the plug.

9. The server of claim 8, wherein the first direction is horizontal, the second direction is vertical, the third position is above the fourth position, the drive component is configured for moving the second moving piece from the fourth position up to the third position and keeping the second moving piece on the third position, when the drive component releases the second moving piece, the second moving piece drops from the third position to the fourth position by gravity.

10. The server of claim 9, wherein the second moving piece defines a chute, the base defines a horizontal groove, the first moving piece comprises a first pin, the first pin is slidably located in the chute and the horizontal groove, when the second moving piece moves, the first pin slides along the chute and the horizontal groove.

11. The server of claim 8, wherein the drive component comprises a magnet and electromagnet, the magnet is located on the top of the base, the electromagnet is located on the second moving piece, the electromagnet is magnetic when powered off and attracts the magnet, the electromagnet is un-magnetic when powered on.

12. The server of claim 9, wherein the second moving piece defines a vertical slot, the base comprises a second pin, the second pin is slidably located in the vertical slot.

13. The server of claim 8, wherein the first moving piece comprises a tube, a tube connector, and a supporting shell, the tube extends in the first direction, the plug connector is located on an end of the tube, the tube connector is located on another end of the tube away from the plug connector, the supporting shell is located on the tube, and the tube passes through the supporting shell, a first pin is located on the supporting shell.

14. The server of claim 13, wherein a bulge ring protrudes from an outer surface of the tube, the supporting shell defines an annular arc groove, section shapes of the annular arc groove and the bulge ring are arc-shaped, and a width of the annular arc groove is larger than a width of the bulge ring, the bulge ring is swingable in the annular arc groove, a spring is located in the supporting shell to reset the tube, an axis of the tube is parallel to the first direction when the tube is reset.

15. A computing system comprising:

a rack comprising a plurality of plugs; and a plurality of servers placed in the rack, each of the plurality of servers comprising:

a chassis;

an electronic part located in the chassis;

a coolant circuit located in the chassis and configured for cooling the electronic part; and a joint module located on the chassis, the joint module comprising:

a base;

a first moving piece located on the base and movable in a first direction between a first position and a second position, the first moving piece being connected with the coolant circuit;

a second moving piece located on the base and movable in a second direction between a third position and a fourth position, the second direction being substantially perpendicular to the first direction;

a drive component located on the base and the second moving piece, the drive component being configured for moving the second moving piece between the third position and the fourth position; and a plug connector located on the first moving piece and configured for connecting the plug to circulate coolant in the coolant circuit, wherein when the second moving piece is on the third position, the first moving piece is on the first position, and the plug connector is connected to the plug, when the second moving piece is on the fourth position, the first moving piece is on the second position, and the plug connector is disconnected with the plug.

16. The computing system of claim 15, wherein the first direction is horizontal, the second direction is vertical, the third position is above the fourth position, the drive component is configured for moving the second moving piece from the fourth position up to the third position and keeping the second moving piece on the third position, when the drive component releases the second moving piece, the second moving piece drops from the third position to the fourth position by gravity.

17. The computing system of claim 16, wherein the second moving piece defines a chute, the base defines a horizontal groove, the first moving piece comprises a first pin, the first pin is slidably located in the chute and the horizontal groove, when the second moving piece moves, the first pin slides along the chute and the horizontal groove.

18. The computing system of claim 15, wherein the drive component comprises a magnet and electromagnet, the magnet is located on the top of the base, the electromagnet is located on the second moving piece, the electromagnet is magnetic when powered off and attracts the magnet, the electromagnet is un-magnetic when powered on.

19. The computing system of claim 15, wherein the first moving piece comprises a tube, a tube connector, and a supporting shell, the tube extends in the first direction, the plug connector is located on an end of the tube, the tube connector is located on another end of the tube away from the plug connector, the supporting shell is located on the tube, and the tube passes through the supporting shell, a first pin is located on the supporting shell.

20. The computing system of claim 19, wherein a bulge ring protrudes from an outer surface of the tube, the supporting shell defines an annular arc groove, section shapes of the annular arc groove and the bulge ring are arc-shaped, and a width of the annular arc groove is larger than a width of the bulge ring, the bulge ring is swingable in the annular arc groove, a spring is located in the supporting shell to reset the tube, an axis of the tube is parallel to the first direction when the tube is reset.

* * * * *